# United States Patent [19]

Davey et al.

[11] 4,298,403
[45] Nov. 3, 1981

[54] ION-IMPLANTED EVAPORATED GERMANIUM LAYERS AS N+ CONTACTS TO GAAS

[76] Inventors: John E. Davey, 3212 Wessynton Way, Alexandria, Va. 22309; Aristos Christou, 7064 Leewood Forest Rd., Springfield, Va. 22151

[21] Appl. No.: 125,426

[22] Filed: Feb. 28, 1980

[51] Int. Cl.³ .............. H01L 29/161; H01L 23/48; H01L 7/38; H01L 21/265

[52] U.S. Cl. .................. 148/1.5; 148/171; 148/177; 357/65

[58] Field of Search .............. 148/1.5, 171, 175, 177; 357/65

[56] References Cited

U.S. PATENT DOCUMENTS 3,959,036  5/1976  Ketchow .............. 148/171
3,987,480 10/1976  Diguet et al. .......... 357/65
4,011,583  3/1977  Levinstein et al. ...... 357/67
4,024,569  5/1977  Hawrylo et al. ........ 357/71

OTHER PUBLICATIONS

Rao et al., J. Appl. Phys., 49, (1978), 3898.
Jaros et al., Solid State Electronics, 18, (1975), 1029.
Itoh et al., J. Appl. Phys., 42, (1971), 5120.
Woodall et al., IBM-TDB, 10, (1968), 1476.

Primary Examiner—L. Dewayne Rutledge
Assistant Examiner—Upendra Roy
Attorney, Agent, or Firm—R. S. Sciascia; William T. Ellis; Melvin L. Crane

[57] ABSTRACT

A method of forming a single, reliable n+ contact for discrete GaAs devices. A film of p-type Ge is deposited uniformly over the surface of a n-type GaAs substrate. Ions of phosphorous or arsenic are implanted to $5 \times 10^{18}$ ions/cc at a depth of 1500 Å. The ends and the sides of the substrate and Ge layer are capped by a CVD oxide and annealed at 450°–500° C. for about one hour. This process over-compensates the initial p-type layers which results in the Ge layer becoming n+. The oxide is removed by an etch process and the n+ Ge is etched to form two separate contact sections of n+ Ge. The n+ Ge is then metalized to form ohmic contacts by use of NiAu. A CVD oxide overcoat may again be applied and annealed at about 500° C. to drive a shallow 200–500 Å, n+ germanium diffusion into the substrate.

11 Claims, 6 Drawing Figures

ION-IMPLANTED EVAPORATED GERMANIUM LAYERS AS N+ CONTACTS TO GAAS

BACKGROUND OF THE INVENTION

This invention relates to GaAs devices and more particularly to a means and method for providing a simple, reliable n+ contact for such devices.

Heretofore various methods have been used to form contacts on GaAs devices. These include an epitaxy n+ layer deposited on a n+ GaAs substrate. The n+ layer is etched in areas other than in the contact regions to get down to the n layer. This process involves complicated chemical deposition equipment which has inherent limitations for large surface devices. Another method involves implanting ions directly into the n GaAs to form an n+ layer in a planar format. High-temperature annealing is required to activate the implanted n+ species and an adequate encapsulant has not been developed to provide contacts of about $10^{18}$ ions/cc doping in reproducible format. N+ dopants may be diffused directly into the GaAs surface. This technique has not been applied successfully due to the high-temperature drive required and to the associated deleterious loss of As. Another method is to make use of an alloy system such as AuGeNi to form the n+ contact. AuGe is evaporated in an 88/12 composition ratio followed by a thin Ni overcoat to prevent "balling up" during sintering with the substrate. This process is not reliable and has reproducibility problems.

SUMMARY OF THE INVENTION

This invention provides a simple, reliable n+ contact technology for discrete GaAs devices and for the emerging GaAs integrated circuit technology. Super-abrupt contacts are made because of a vacuum deposition process which initially forms the film on the substrate and ion implantation which dopes the film n+ over its entire area. These allow a much lower anneal temperature than required in the prior art.

DETAILED DESCRIPTION

Figure 1:
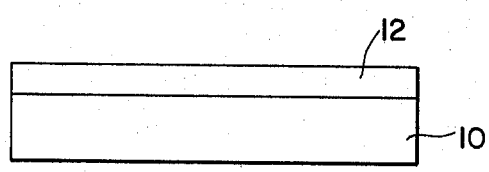
FIGS. 1–6 illustrate the separate steps of the process for aming n+ contacts on GaAs.

The invention will be described referring to FIGS. 1–6. FIG. 1 illustrates a GaAs substrte 10 with a thin film of Ge (p-type) 12 having a thickness of about 3000 Å deposited on the substrate. The substrate is placed in an ultra-high vacuum system evacuated to about $1\times10^{-9}$ Torr. The substrate is heated to a temperture of about 575° C. for about 15 minutes to desorb the gases within the GaAs substrate. Subsequent to heating the substrate, the substrate is cooled to 475° C. and the Ge film is deposited evenly over the surface of the GaAs sunstrate to form a super-abrupt interface. The Ge-coated GaAs substrate is cooled in the vacuum chamber and then removed from the vacuum chamber.

Figure 2:
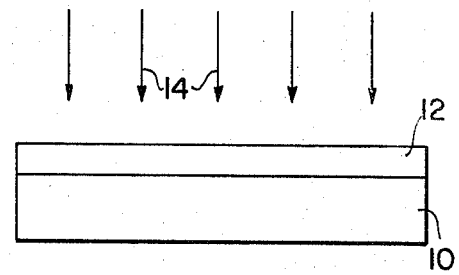

As shown in FIG. 2, phosphorous or arsenic ions 14 are implanted in the Ge film to a depth of about 1500 Å with a dosage of about $5\times10^{18}$ ions/cc. Any well-known equipment can be used for the ion implantation.

Figure 3:
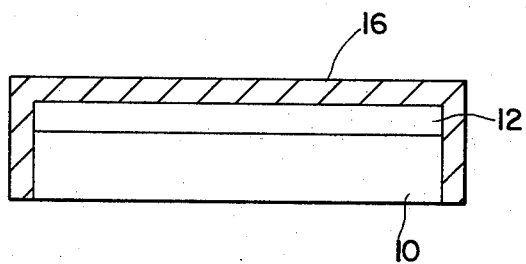

As shown in FIG. 3, the ion-planted Ge-GaAs is capped over the Ge film and the periphery with a chemical vapor deposit of oxide, ($SiO_2$)16 at a temperature of about 400° C. Subsequent to capping the Ge-GaAs, the composite is annealed at a temperature of up to about 500° C. for about one hour in an inert gas ambient. Annealing the composite over-compensates the initial p-type Ge layer which results in the germanium film 18 becoming n+. The oxide cap on the periphery prevents the arsenide from evaporating or dissociating during the anneal process.

Figure 4:
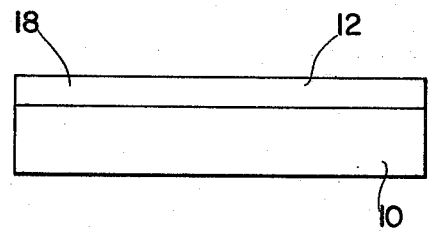

As shown in FIG. 4, the CVD oxide cap has been removed by any well-known chemical etch process which does not attach the Ge film-GaAs.

Figure 5:
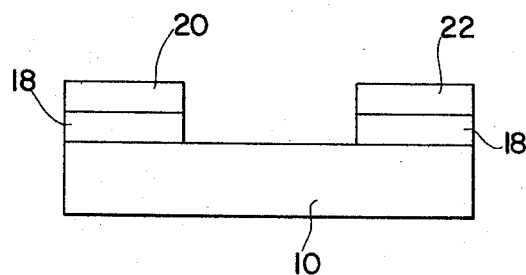

FIG. 5 illustrates the finished GaAs device. Once the CVD oxide cap has been removed, as shown in FIG. 4, photolithographic processes can be used to etch the Ge film 18 to form a simple contact configuration. Once the simple contact configuration has been formed, the device is prepared by well-known processes and placed in a vacuum in which NiAu, Ni, or Au ohmic metalization is deposited onto the germanium contact configurations to form contacts 20 and 22.

Figure 6:
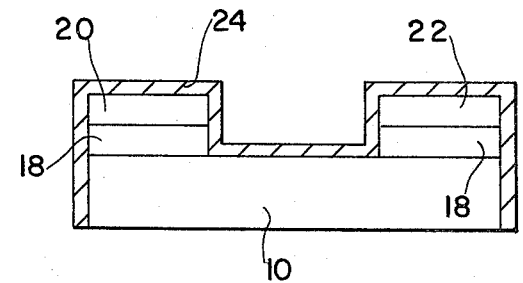

The finished GaAs device shown in FIG. 5 may be capped again with a CVD oxide 24 as shown in FIG. 6 and annealed at a temperature of about 500° C. for a time of about one hour to drive a shallow 200–500 Å n+ germanium diffusion into the GaAs substrate. Subsequent to the anneal, the oxide cap 24 is removed.

Germanium is a material that lattice and thermally matches GaAs. One of the unique features of this invention is using a Ge evaporated film as the host for the n+ implant which will activate in Ge at a temperature of about 500° C. The process enables one to form large-area, uniform super-abrupt contacts because the process utilizes a vacuum deposition process to initially form the Ge film and an ion implantation which dopes the Ge film uniformly over its entire area. The anneal step required to activate the layer is at a significantly lower temperature than that of the CVD deposition of n+ layers or the activation of ion implant directly into prior-art GaAs substrates.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method for forming n+ contacts for GaAs devices which comprises:
    depositing a p-type Ge film onto a GaAs substrate,
    implanting ions of arsenic or phosphorous into said Ge film to a desired depth,
    capping said Ge film on the top and sides and on the sides of the GaAs substrate with an oxide,
    annealing said capped Ge film-GaAs substrate in an inert gas ambient at a sufficient temperature over a sufficient time period to over-compensate the p-type Ge layer to change the p-type layer to an n+ layer,
    removing the oxide cap,
    etching said n+ Ge film to form contact areas, and
    depositing an ohmic metallization on the contact areas.
2. A method as claimed in claim 1 in which:
    said GaAs substrate is desorbed at a temperature of about 575° C. for about 15 minutes prior to depositing said Ge film.
3. A method as claimed in claim 2 in which:
    said Ge film is deposited to a thickness of about 3000 Å at a temperature of about 475° C.
4. A method as claimed in claim 3 in which:

said ions are implanted at a depth of 1500 Å with a dosage of $5 \times 10^{18}$ ions/cc.

5. A method as claimed in claim 3 in which:
said capped Ge film-GaAs substrte is annealed at a temperature of from about 450° C. to about 500° C. for about one hour to convert said p-type Ge to n+.

6. A method as claimed in claim 4 in which:
said capped Ge film-GaAs substrte is annealed at a temperature of from about 450° C. to about 500° C. for about one hour to convert said p-type Ge to n+.

7. A method as claimed in claim 5 in which:
said ohmic metallization on said contact areas are selected from a group consisting of AuNi, Au, and Ni.

8. A method as claimed in claim 6 in which:
gold contacts are deposited onto said contact areas.

9. A method as claimed in claim 6 in which:
nickel contacts are deposited onto said contact areas.

10. A method as claimed in claim 6 in which:
AuNi contacts are deposited onto said contact areas.

11. A method as claimed in claim 1 in which:
a CVD oxide cap is deposited over the said contacts and the periphery of said GaAs device, and
said capped GaAs device is annealed at a temperature of about 500° C. for a time period of about one hour to drive a shallow 200–500 Å n+ germanium diffusion into said GaAs substrate, and
removing the oxide cap previously applied over the contacts and GaAs device.

* * * * *